(12) United States Patent
Tang

(10) Patent No.: US 12,567,458 B2
(45) Date of Patent: Mar. 3, 2026

(54) MEMORY AND MEMORY SYSTEM

(71) Applicant: CHANGXIN MEMORY TECHNOLOGIES, INC., Anhui (CN)

(72) Inventor: Yanzhe Tang, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 162 days.

(21) Appl. No.: 18/530,200

(22) Filed: Dec. 5, 2023

(65) Prior Publication Data

US 2024/0105256 A1 Mar. 28, 2024

Related U.S. Application Data

(63) Continuation of application No. PCT/CN2022/130570, filed on Nov. 8, 2022.

(30) Foreign Application Priority Data

Sep. 19, 2022 (CN) .......................... 202211139262.7

(51) Int. Cl.
*G11C 11/00* (2006.01)
*G11C 11/408* (2006.01)
(Continued)

(52) U.S. Cl.
CPC ...... *G11C 11/4096* (2013.01); *G11C 11/4085* (2013.01); *G11C 11/4097* (2013.01)

(58) Field of Classification Search
CPC ............ G11C 16/0433; G11C 13/0069; G11C 13/0023; G11C 13/0026; G11C 13/0028;
(Continued)

(56) References Cited

U.S. PATENT DOCUMENTS 7,391,668 B2 * 6/2008 Natori .................. G09G 3/3611
365/230.03
2019/0333967 A1 10/2019 Park
2020/0381037 A1 12/2020 Kim

FOREIGN PATENT DOCUMENTS

CN 110176265 A 8/2019
CN 110827886 A 2/2020
(Continued)

OTHER PUBLICATIONS

International Search Report in the international application No. PCT/CN2022/130570, mailed on Mar. 22, 2023. 6 pages with English translation.

*Primary Examiner* — Thong Q Le
(74) *Attorney, Agent, or Firm* — SYNCODA LLC; Feng Ma

(57) ABSTRACT

A memory includes a substrate, a control circuit layer located in the substrate, and at least two memory structure layers. The control circuit layer includes at least part of control circuits of the memory. The at least two memory structure layers are sequentially stacked on the control circuit layer. Each memory structure layer includes multiple memory blocks arranged in an array. The memory block includes multiple parallel Word Lines (WLs) extending in a first direction. The first direction is parallel to a surface of the substrate. An opening is provided between adjacent memory blocks located in the same memory structure layer. The openings located in different memory structure layers go through each other. WLs in the at least one memory structure layer are connected to the control circuit layer through the openings that go through each other.

17 Claims, 9 Drawing Sheets

(51) Int. Cl.
 *G11C 11/4096* (2006.01)
 *G11C 11/4097* (2006.01)

(58) Field of Classification Search
 CPC .............. G11C 13/004; G11C 11/4085; G11C
 11/4087; G11C 11/4097; G11C 13/003;
 G11C 2013/0078; G11C 2207/16; G11C
 2211/4013; G11C 5/147; G11C 7/16;
 G11C 7/18; G11C 8/14; G11C 11/1655;
 G11C 11/1657; G11C 11/1659; G11C
 11/1673; G11C 11/1675; G11C 13/0004;
 G11C 16/06; G11C 16/12; G11C 16/16;
 G11C 16/30; G11C 16/32; G11C 16/344;
 G11C 16/3445; G11C 17/126; G11C
 2013/0042; G11C 2207/2254; G11C
 2213/71; G11C 2213/72; G11C 2213/73;
 G11C 2213/77; G11C 2216/20; G11C
 29/021; G11C 29/028; G11C 29/24;
 G11C 5/02; G11C 5/025; G11C 5/06;
 G11C 7/14; G11C 8/10; G11C 11/22;
 G11C 16/102; G11C 17/18; G11C
 2013/0045; G11C 2207/104; G11C
 29/4401
 See application file for complete search history.

(56) References Cited

FOREIGN PATENT DOCUMENTS

| CN | 111788685 A | 10/2020 |
|---|---|---|
| CN | 112038348 A | 12/2020 |
| CN | 113366637 A | 9/2021 |
| CN | 113870909 A | 12/2021 |
| WO | 2022016455 A1 | 1/2022 |

* cited by examiner

MEMORY AND MEMORY SYSTEM

CROSS-REFERENCE TO RELATED APPLICATIONS

This is a continuation of International Application No. PCT/CN2022/130570 filed on Nov. 8, 2022, which claims priority to Chinese Patent Application No. 202211139262.7 filed on Sep. 19, 2022. The disclosures of the above-referenced applications are hereby incorporated by reference in their entirety.

BACKGROUND

With the continuous development of current science and technology, semiconductor devices are widely used in various electronic devices and electronic products. Among them, a Dynamic Random Access Memory (DRAM), as a volatile memory, is a semiconductor memory device commonly used in computers.

The DRAM has a memory array composed of many repetitive memory cells. Each memory cell includes a selection transistor and a memory node connected to the selection transistor. Different states of the memory node are configured to represent stored information, i.e. "0" or "1". In order to improve the storage capacity of the memory, the semiconductor devices are required to have higher storage density and smaller feature size. How to integrate more memory cells in a unit area, reduce the area occupied by each device, and simplify the wiring design and manufacturing process of the memory has become an urgent problem to be solved in the industry.

SUMMARY

The disclosure relates to the technical field of semiconductors, and in particular to but not limited to a memory and a memory system.

In a first aspect, the embodiments of the disclosure provide a memory, which includes a substrate, a control circuit layer located in the substrate, and at least two memory structure layers. The control circuit layer includes at least part of control circuits of the memory. The at least two memory structure layers are sequentially stacked on the control circuit layer. Each of the multiple memory structure layers includes multiple memory blocks arranged in an array. Each of the multiple memory blocks includes multiple Word Lines (WLs) parallel to each other and extending in a first direction. The first direction is parallel to a surface of the substrate. An opening is provided between adjacent memory blocks located in the same memory structure layer. Openings located in different memory structure layers go through each other. WLs in at least one of the at least two memory structure layers are connected to the control circuit layer through the openings that go through each other.

In a second aspect, the embodiments of the disclosure provide a memory system, which may include the memory in any one of the above embodiments and a memory controller.

DETAILED DESCRIPTION

Figure 1:
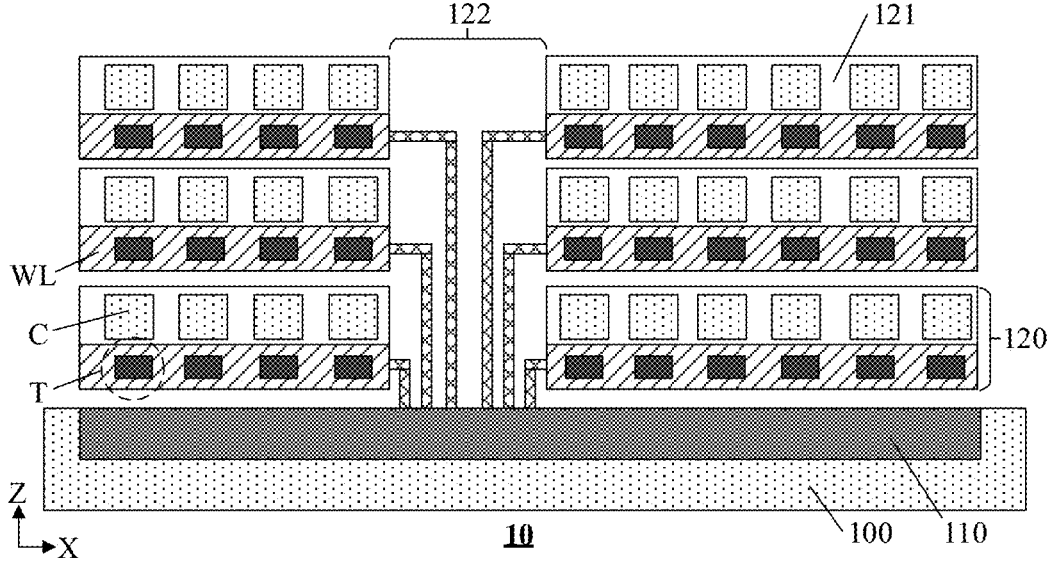
FIG. 1 is a schematic diagram of a memory according to an embodiment of the disclosure.

In order to facilitate an understanding of the disclosure, a more complete description of exemplary implementations of the disclosure will be described below more comprehensively with reference to the associated drawings. Although the exemplary implementations of the disclosure are shown in the drawings, it is to be understood that the disclosure may be implemented in various forms and should not be limited to the specific implementations set forth herein. Rather, these implementations are provided so that the disclosure can be more thoroughly understood, and can fully convey the scope of the disclosure to those skilled in the art.

In the following description, numerous specific details are given to provide a more thorough understanding of the disclosure. However, it is apparent to those skilled in the art that the disclosure may be implemented without one or more of these details. In some embodiments, some technical features that are well known in the art have not been described in order to avoid confusion with the disclosure, i.e., all features of an actual embodiment may not be described, and well-known functions and structures are not described in detail.

In general, terms may be understood at least in part from their use in context. For example, depending at least in part on context, the term "one or more" as used herein may be used to describe any feature, structure or characteristic in a singular sense, or may be used to describe combinations of features, structures or characteristics in a plural sense. Similarly, a term such as "a/an" or "the" may also be construed to convey a singular use or to convey a plural use, depending at least in part on the context. In addition, the term "based on" may be understood as not necessarily intended to convey an exclusive set of factors, and instead may allow for additional factors not necessarily expressly described, again depending at least in part on the context.

Unless otherwise defined, the terms used herein are for the purpose of describing specific embodiments only and are not intended to limit the disclosure. As used herein, the singular forms "a/an", "one", and "the" are also intended to include the plural forms, unless otherwise specified in the context. It is also to be understood that, when terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" used herein includes any and all combinations of associated listed items.

In order that the disclosure is thoroughly understood, detailed steps as well as detailed structures will be set forth in the following description in order to explain the technical solutions of the disclosure. Preferred embodiments of the disclosure are described in detail below, however the disclosure may have other implementations besides these detailed descriptions.

Figure 2:
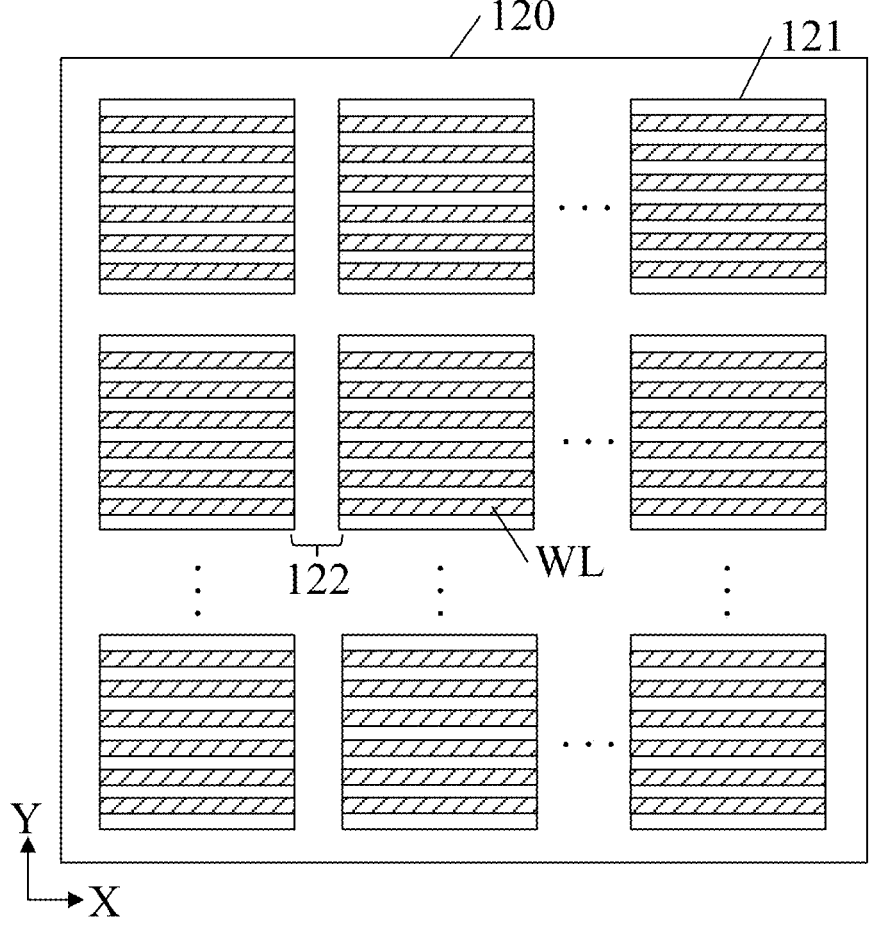
FIG. 2 is a top view of a memory structure layer in a memory according to an embodiment of the disclosure.

As shown in FIG. 1 and FIG. 2, embodiments of the disclosure provide a memory 10, which includes a substrate 100, a control circuit layer 110, and at least two memory structure layers 120.

The control circuit layer 110 is located in the substrate 100. The control circuit layer 110 includes at least part of control circuits of the memory 10. The at least two memory structure layers 120 are sequentially stacked on the control circuit layer 110. The memory structure layer 120 includes multiple memory blocks 121 arranged in an array. The memory block 121 includes multiple parallel WLs extending in a first direction. The first direction is parallel to a surface of the substrate 100. An opening 122 is provided between adjacent memory blocks 121 located in the same memory structure layer 120. The openings 122 located in different memory structure layers 120 go through each other. WLs in the at least one of the at least two memory structure layers 120 are connected to the control circuit layer 110 through the openings 122 that go through each other.

In the embodiments of the disclosure, the memory 10 may include, but is not limited to, a DRAM, a Static Random Access Memory (SRAM), a Ferroelectric Random Access Memory (FRAM), a Magnetic Random Access Memory (MRAM), a Phase Change Random Access Memory (PCRAM), a Resistive Random Access Memory (RRAM), a Nano Random Access Memory (NRAM), etc. The material of the substrate 100 may include an elemental semiconductor material, such as silicon (Si), germanium (Ge), or the like, or a compound semiconductor material, such as gallium nitride (GaN), gallium arsenide (GaAs), indium phosphide (InP), or the like. The substrate 100 may also be doped, or include a doped area and an undoped area. It is to be understood that in order to enable each structure to be clearly shown in the figures, it may be possible that the scale of the dimensions of each structure does not conform to the actual structure. It is to be noted that in the disclosure, a horizontal direction refers to a direction parallel to the surface of the substrate 100, including, but not limited to, an X direction and a Y direction, and a vertical direction refers to a direction perpendicular to the surface of the substrate 100, such as a Z direction.

Exemplarily, the memory block in the embodiments of the disclosure may be composed of multiple memory cells having a "1T1C" (a selection transistor T and a memory capacitor C) structure. The selection transistor is configured to control the signal on-off between the memory cell and the control circuit. When data is written to and read from memory cell, the selection transistor needs to be switched to a conductive state to transfer charges between the memory capacitor and an external device. The memory capacitor performs a data storage function based on the stored charges. Because an electrode of the memory capacitor shows different potentials when the charges stored in the memory capacitor are different, the binary data is read and written by switching the memory status of the memory capacitor. For example, when the memory capacitor is in a charged state, it represents data "1", and when the memory capacitor is in a discharged state (uncharged state), it represents data "0". By detecting the voltage on the electrode of the memory capacitor, it may be determined whether the state is the charged state or the discharged state (uncharged state), and then the data is read.

In some embodiments, the control circuit in the memory and the multiple memory blocks arranged in an array are located in the same plane parallel to the surface of the substrate, and the control circuit is located, in the horizontal direction, around the multiple memory blocks arranged in an array, so that the area occupied by the memory in the horizontal direction is large, and the integration density is low. It is to be understood that, in this case, in order to achieve high storage density, it is necessary to further reduce the size of the memory cell, which makes the manufacturing process more difficult. In addition, because the height difference between the control circuit and the multiple memory blocks in the vertical direction is large, and the control circuit and the multiple memory blocks are formed in the same process, the height of a conductive plug (Local Interconnect Contact (Licon)) in the control circuit is high, and the contact resistance is large, which may affect the drive current of the transistor and make the performance of the memory poor.

In the embodiments of the disclosure, as shown in FIG. 1, the control circuit layer 110 is located in the substrate 100, and the control circuit layer 110 includes at least part of the control circuits of the memory 10. Exemplarily, the control circuit layer 110 includes, but is not limited to, an SWD, an SA, a row decoder, a column decoder, a fuse repair circuit, a power circuit, a data I/O circuit, etc. The control circuit layer 110 may be configured to decode and detect the memory cell, and control the memory cell to perform operations such as data writing and reading.

The at least two sequentially stacked memory structure layers 120 are disposed on the control circuit layer 110, that is, the at least two memory structure layers 120 are located on a surface of a side, far away from the substrate 100, of the control circuit layer 110 and stacked in the Z direction. The memory structure layer 120 is configured to perform the operations such as data writing and reading according to the control signals sent from the control circuit layer 110. FIG. 2 shows a top view of a memory structure layer 120. Each memory structure layer 120 includes multiple memory blocks 121 arranged in an array. Here, the memory block 121 may be a Memory Array Tile (MAT). The memory block 121 may include multiple parallel WLs extending in the first direction, the first direction may be the X direction, and the first direction is parallel to the surface of the substrate 100. Exemplarily, the WL may be a local WL. One WL may be connected to the selection transistors of the multiple memory cells located in its extending direction in the memory block 121, so that the multiple selection transistors may be switched on or off based on the control signals sent from the control circuit layer 110 to complete the operations such as data writing and reading. In this way, the at least two memory structure layers 120 are stacked on the control circuit layer 110 in the direction perpendicular to the surface of the substrate 100, so that a three-dimensional memory structure is formed, which may reduce the area occupied by the memory 10 in the horizontal direction without further reducing the size of the memory cell, and is conducive to improving the integration degree. On the other hand, each memory structure layer 120 may be sequentially formed on the control circuit layer 110 without being limited by the process of the conductive plug, Shallow Trench Isolation (STI), metal silicon, etc., so that the manufacturing cost of the memory 10 may be saved, and it is ensured that the control circuit and each transistor in the memory block have better performance.

In the embodiments of the disclosure, as shown in FIG. 1, the opening 122 is provided between the adjacent memory blocks 121 located in the same memory structure layer 120. It is to be understood that the adjacent memory blocks 121 may refer to two adjacent memory blocks 121 in the X direction or two adjacent memory blocks 121 in the Y direction. The openings 122 located in the different memory structure layers 120 go through each other, that is, projections of the openings 122 in the Z direction on the substrate 100 at least partially coincide with each other, thereby forming a channel structure that goes through the multiple memory structure layers 120. Each WL in the at least one memory structure layer 120 is connected to the control circuit layer 110 through the through openings 122, so that an area of each memory structure layer 120 located at the opening 122 may be used as a lead-out area of the WL to facilitate connection of the multiple WLs in each layer to the control circuits in the control circuit layer 110, thereby simplifying the wiring design and manufacturing process. In addition, the area occupied by the lead-out area of the WL is small, which further improves the integration level of the memory 10.

Figure 3:
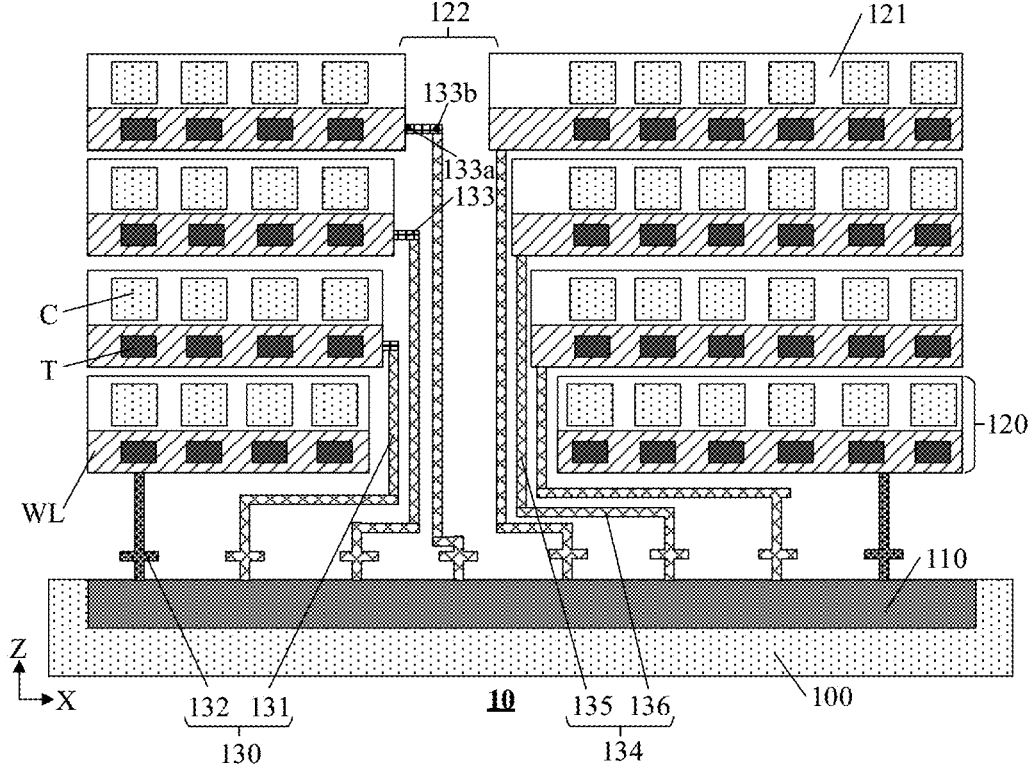
FIG. 3 is a schematic diagram of connection structures in a memory according to an embodiment of the disclosure.

In some embodiments, as shown in FIG. 3, the widths of the openings 122 located in the different memory structure layers 120 sequentially decrease in an upward direction from the substrate 100.

In the embodiments of the disclosure, in the Z direction, the widths of the openings 122 in the memory structure layers 120 decrease layer by layer in the upward direction from the substrate 100. Here, the width of the opening 122 refers to a distance between the two adjacent memory blocks 121 in the X direction or in the Y direction. In this way, the edges of the memory structure layers 120 at the openings 122 are stepped, and the lengths of the WLs in the memory structure layers 120 at the openings 122 increase layer by layer from bottom to top, so that the WL may be directly lead out from a lower surface of the memory structure layer 120 where the WL is located and connected to the control circuit layer 110, thereby simplifying the manufacturing process of the memory 10 and reducing the area occupied by the lead-out area of the WL in the horizontal direction.

In some embodiments, as shown in FIG. 3, the memory 10 further includes multiple connection structures 130. The connection structures 130 connect the WLs with the control circuit layer 110 in a direction perpendicular to the surface of the substrate 100.

In the embodiments of the disclosure, the memory 10 further includes the multiple connection structures 130. The materials of the connection structures 130 include, but are not limited to, conductive materials such as copper, tungsten and doped polysilicon. Each of the connection structures 130 has a portion extending in the Z direction and is configured to connect the respective WL in each memory structure layer 120 to the control circuit layer 110 in the Z direction, so that the control circuit layer 110 may control the conduction and cutoff of the selection transistors in the multiple memory cells through the WL, so as to perform the operations of data reading and writing.

In some embodiments, the memory further includes multiple compensating resistors, each of which is connected to a respective connection structure. Resistance value of each compensating resistor is inversely proportional to the length of the corresponding connection structure.

In the embodiments of the disclosure, each connection structure may further be connected to the compensation resistor. It is to be understood that the WLs located in the different memory structure layers may be connected to the control circuit layer through the connection structures of different lengths, so that the control circuit layer has different drive capabilities for the WLs in different memory structure layers. Therefore, the compensation resistor connected to each connection structure may be provided, and the resistance value of the compensation resistor is inversely proportional to the length of the connection structure. That is, the shorter the connection structure is, the larger the resistance value of the compensation resistor is, so that the connection structures connected to the WLs in different memory structure layers are basically the same as the total resistance value of the compensation resistor, and thus the control circuit layers have the basically the same drive capability for each WL. It is to be understood that the resistance value of the compensation resistor may also be determined by the length of the connection structure and the length of the WL, which further ensure that the control circuit layer has the same drive capability for the WLs in different memory structure layers.

In some embodiments, as shown in FIG. 3, the opening 122 is located between the adjacent memory blocks 121 in the first direction, and the connection structure 130 includes a first connection structure 131 and a second connection structure 132. The first connection structure 131 goes through the at least one opening 122 in the direction perpendicular to the surface of the substrate 100. Each WL in the memory structure layer 120 above the memory structure layer 120 at a lowest layer is connected to the control circuit layer 110 through a respective first connection structure 131. The second connection structure 132 is located between the memory structure layer 120 at the lowest layer and the control circuit layer 110. Each WL in the memory structure layer 120 at the lowest layer is connected to the control circuit layer 110 through a respective second connection structure 132.

In the embodiments of the disclosure, the opening 122 may be located between the two adjacent memory blocks 121 in the X direction. The connection structure 130 includes the first connection structure 131 and the second connection structure 132. Herein, the first connection structure 131 passes through the at least one opening 122 in the Z direction, that is, the portion, extending in the Z direction, of the first connection structure 131 is located in the multiple openings 122 that go through each other. In this way, the WL in each memory structure layer 120 above the memory structure layer 120 at the lowest layer may be connected to the control circuit layer 110 by the first connection structure 131 through the multiple openings 122 that go through each other. That is, each WL in the memory structure layer 120 above the lowest layer may be connected to a respective first connection structure 131 in the stepped lead-out area. This connection manner is relatively simple and conducive to simplifying the manufacturing process.

The second connection structure 132 is located between the memory structure layer 120 at the lowest layer and the control circuit layer 110, and the WLs in the memory structure layer 120 at the lowest layer are directly connected to the control circuit layer 110. That is, the second connection structure 132 may not be located in the opening 122, and the WLs in the memory structure layer 120 at the lowest layer may be directly led out from a surface of a side, close to the control circuit layer 110, of the memory structure layer 120 at the lowest layer through the second connection structure 132, and connected to the control circuit layer 110. It is to be understood that, because the second connection structure 132 does not pass through the opening 122, the length is shorter, which is conducive to simplifying the manufacturing process and saving costs.

In some embodiments, the first connection structure 131 is connected to the control circuit layer 110 through the openings 122 below the WL in a direction perpendicular to the substrate 100. Alternatively, the first connection structure 131 extends from an end, close to the opening 122, of the WL to the opening 122 in the first direction, and is connected to the control circuit layer 110 through the openings 122 below the WL in the direction perpendicular to the substrate 100.

In the embodiments of the disclosure, as shown in FIG. 3, the first connection structure 131 may be connected to the WL in the Z direction. The first connection structure 131 may also be connected to an end, close to the opening 122, of the WL in the X direction. Exemplarily, as shown in FIG. 3, the multiple memory blocks 121 may be stacked in a staggered manner in the Z direction, at this point, the first connection structure 131, on one hand, may be directly connected to the underside of the WL and on the other hand, connected to the control circuit layer 110 through multiple openings 122 below the WL. As shown in FIG. 1, projections of the multiple memory blocks 121 stacked in the Z direction onto the substrate 100 may coincide, that is, the multiple memory blocks 121 are not stacked in the staggered manner. At this point, the first connection structure may be connected to an end, close to the opening 122, of the WL, that is, the first connection structure may first extend into the opening 122 nearest to the WL in the X direction, and then bent and vertically connected to the control circuit layer 110 through the multiple openings 122 that go through each other under the WL. It is to be noted that the extension direction and bending manner of the first connection structure are not limited to the situation shown in the drawings.

In some embodiments, as shown in FIG. 3, the first connection structure 131 includes a first wire 133 and a second wire 134. The first wire 133 is parallel to the surface of the substrate 100. A first end 133*a* of the first wire 133 is connected to the WL in the memory structure layer 120, and a second end 133*b* of the first wire 133 is located in the opening 122 of the memory structure layer 120 where the first end 133*a* is located. The second wire 134 passes through the at least one opening 122, and the second wire 134 is connected to the second end 133*b* of the first wire 133 and the control circuit layer 110.

In the embodiments of the disclosure, the first connection structure 131 includes the first wire 133 and the second wire 134. Here, the first wire 133 may be parallel to the surface of the substrate 100, and the first end 133*a* of the first wire 133 is connected to the WL, the second end 133*b* is located in the opening 122 of the same memory structure layer 120, the second end 133*b* of the first wire 133 is connected to the second wire 134, and the WL is connected to the control circuit layer 110 through the first wire 133 and the second wire 134. It is to be understood that the first wire 133 is configured to extend the WL to the opening 122 in the horizontal direction, so that the WL is connected to the control circuit layer 110 through the second wire 134 passing through the at least one opening 122.

In some embodiments, the first connection structure 131 may not have the first wire 133. Exemplarily, the WL may be directly connected to the second wire 134 through the surface of a side, close to the substrate 100, of the memory structure layer 120, that is, the WL does not pass through the opening 122 in the memory structure layer 120 where the WL is located, thereby further simplifying the wiring design of the memory 10.

In some embodiments, as shown in FIG. 3, the second wire 134 includes a first portion 135 and a second portion 136. The first portion 135 is located in the at least one opening 122, and is perpendicular to the surface of the substrate 100. The first portion 135 is connected to the second end 133*b* of the first wire 133. The second portion 136 is located below the lowest memory structure layer 120. The second portion 136 is parallel to the surface of the substrate 100, and is connected to the first portion 135 and the control circuit layer 110.

In the embodiments of the disclosure, the second wire 134 includes the first portion 135 and the second portion 136. Herein, the first portion 135 is located in the opening 122 and extends in the Z direction, it is to be understood that the first portion 135 may be connected to the second end 133*b* of the first wire 133 or be directly connected to the WL on the surface of a side, close to the substrate 100, of the memory structure layer 120. The second portion 136 is located below the memory structure layer 120 at the lowest layer, and connects the first portion 135 to the control circuit layer 110. That is, the second portion 136 may extend in the horizontal direction, so as to change a contact position of the second wire 134 and the control circuit layer 110, thereby realizing the flexible connection of the WL and the control circuit layer 110.

Figure 4:
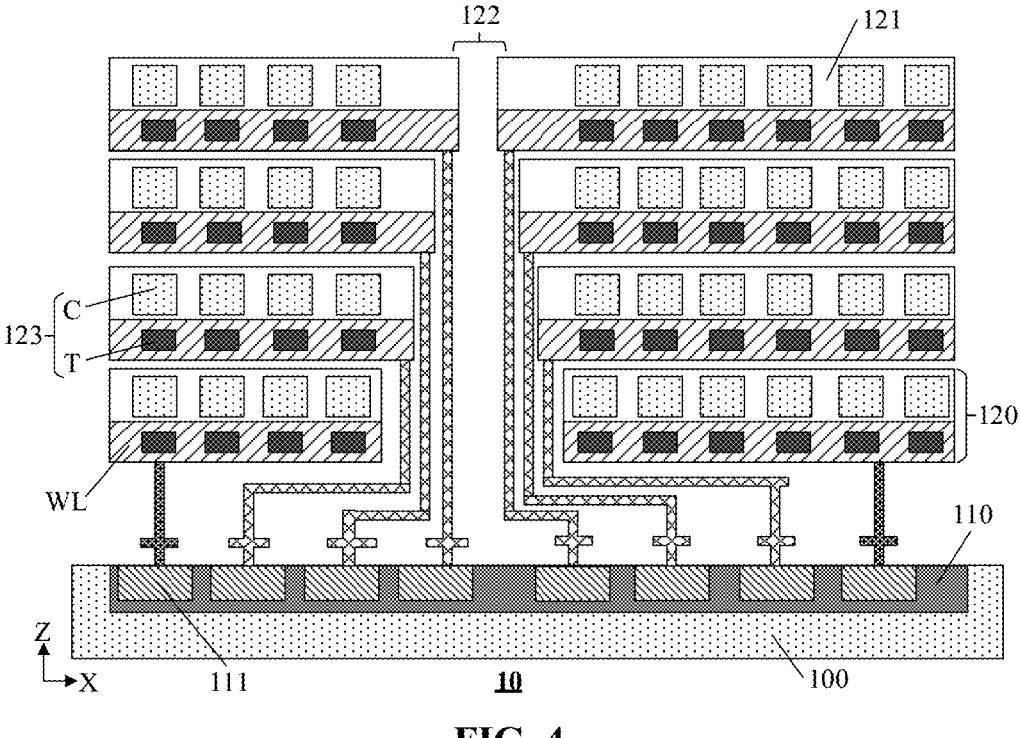
FIG. 4 is a schematic diagram of control blocks in a memory according to an embodiment of the disclosure.

In some embodiments, as shown in FIG. 4, the control circuit layer 110 includes multiple control blocks 111, each of which is connected to a respective memory block 121.

In the embodiments of the disclosure, the memory block 121 may be connected to the control block 111 in the control circuit layer 110. The control block 111 may perform the operations such as writing and reading on the multiple memory cells in the storage block 121 through the WL, a BL, and other connection structures. It is to be understood that a connection relationship between the control block 111 and the memory block 121 may be a one-to-one correspondence, or a one-to-many, many-to-one or many-to-many relationship.

In some embodiments, as shown in FIG. 4, an area where the control block 111 is located and a projection area, on the control circuit layer 110, of the memory block 121 connected to the control block 111 at least partially coincide. That is, at least part of the area of each control block 111 is located below the memory block 121 connected thereto, so as to facilitate the wiring planning and improve the space utilization of each connection structure.

In some embodiments, as shown in FIG. 4, the memory block 121 includes multiple memory cells 123 arranged in an array. Each WL is connected to the multiple the memory cells 123 arranged in the first direction. The memory cells 123 in the at least one memory structure layer 120 are connected to the control block 111 through the WL and the openings 122 that go through each other.

In the embodiments of the disclosure, each WL in the memory block 121 is connected to the multiple memory cells 123 arranged in the first direction, namely the X direction. The memory cells 123 in the at least one memory structure layer 120 may be connected to the control block 111 through the WL, the connection structure in the above embodiment and the through opening(s) 122, so that the control block 111 may control the conduction or cutoff of the selection transistors in the multiple memory cells 123 through the WL. In some embodiments, each memory block 121 may be independently connected to the control block 111, and independently controlled by the control block 111.

In some embodiments, the WL of one memory block 121 may be independent and not connected to the WL in other memory blocks 121. In another embodiment, the multiple memory blocks 121 arranged in parallel may share the WL.

Figure 5:
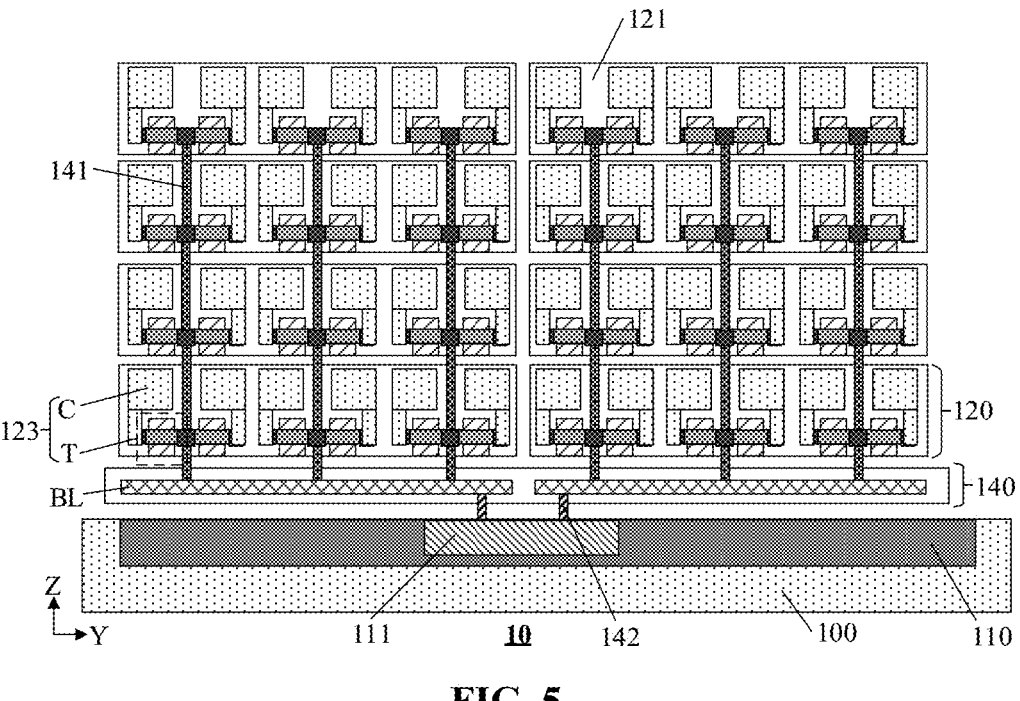
FIG. 5 is a schematic diagram of BL structure layers in a memory according to an embodiment of the disclosure.

In some embodiments, FIG. 5 shows a schematic diagram of a memory 10 in a YZ direction. The memory 10 further includes a BL structure layer 140 located between the control circuit layer 110 and the at least two memory structure layers 120. The BL structure layer 140 includes multiple BLs extending in a second direction. An angle is provided between the second direction and the first direction, and the second direction is parallel to the surface of the substrate 100. Each BL is connected to the multiple groups of memory cells 123 arranged in the second direction, each group of memory cells 123 includes the multiple memory cells 123 connected through a first connection line and stacked in the direction perpendicular to the surface of the substrate 100.

In the embodiments of the disclosure, the BL structure layer 140 is located between the memory structure layer 120 at the lowest layer and the control circuit layer 110, and the BL structure layer 140 has the multiple BLs extending in the second direction. Here, the second direction may be the Y direction or other directions at a certain angle to the X direction.

The at least two memory structure layers 120 have the multiple groups of memory cells 123 arranged in the Y direction. One group of memory cells 123 refers to the multiple memory cells 123 connected through the first connection line 141 and stacked in the Z direction. That is, the multiple memory cells 123 in each group of memory cells are located in the different memory structure layers 120, and are connected together through the first connection line 141 extending in the Z direction.

In some embodiments, the selection transistors in the two adjacent memory cells 123 in the Y direction in the same memory structure layer 120 are connected to the same first connection line 141, and the multiple first connection lines 141 located on the same line in the Z direction are connected to the same BL. The BL is connected to the control circuit layer 110 through a second connection line 142.

It is to be understood that the multiple first connection lines 141 passing through the memory structure layer 120 may be connected to the same BL.

The same BL may provide electrical connections for the multiple groups of memory cells 123 arranged in the Y direction. Here, each group of memory cells 123 is the multiple memory cells 123 connected to the same first connection line 141 described above.

Because at least two memory structure layers 120 are provided, the memory cells 123 in the embodiments of the disclosure are arranged in a three-dimensional structure array on the substrate 100 and the control circuit layer 110. That is, the memory cells 123 connected to the BL include the multiple memory cells 123 on one surface.

For the memory cells 123 connected to the same BL, the individual control of each memory cell 123 may be achieved by individually gating the selection transistor of each memory cell 123.

The control circuit layer 110 may include circuits and devices connected to the BLs and configured to perform reading and writing operations on various memory cells 123 through the BLs. Because the BLs extend in the first direction parallel to the surface of the substrate 100, the second connection lines 142 perpendicular to the substrate are also required to be connected between the BLs and the control circuit layer 110.

Figure 6:
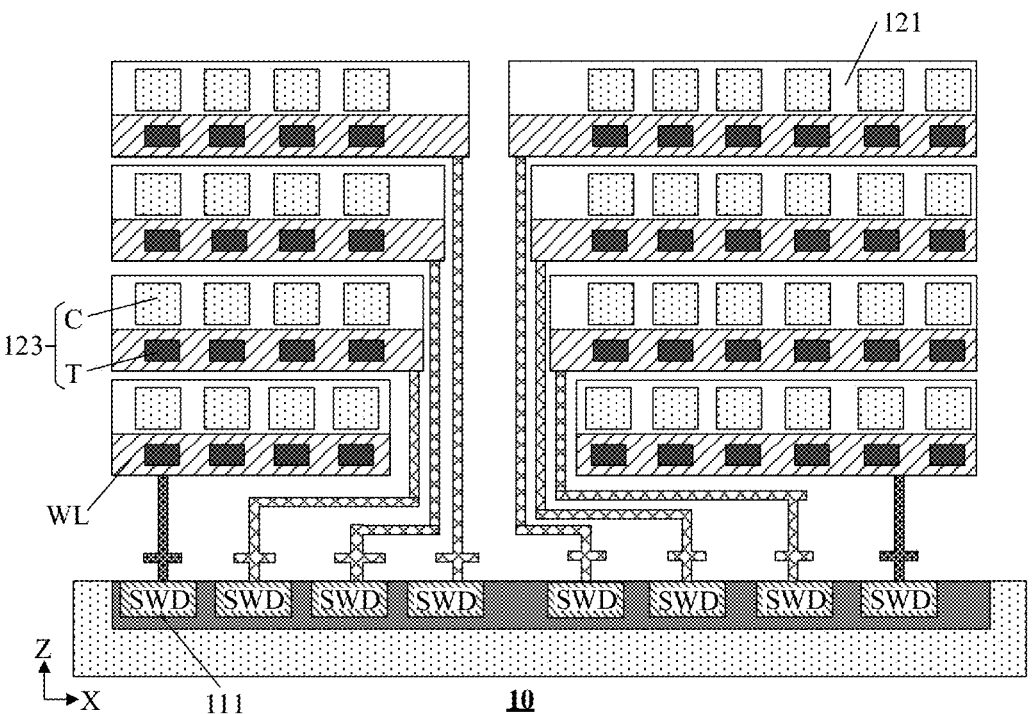
FIG. 6 is a schematic diagram of Sub Wordline Drivers (SWDs) in a memory according to an embodiment of the disclosure.
Figure 7:
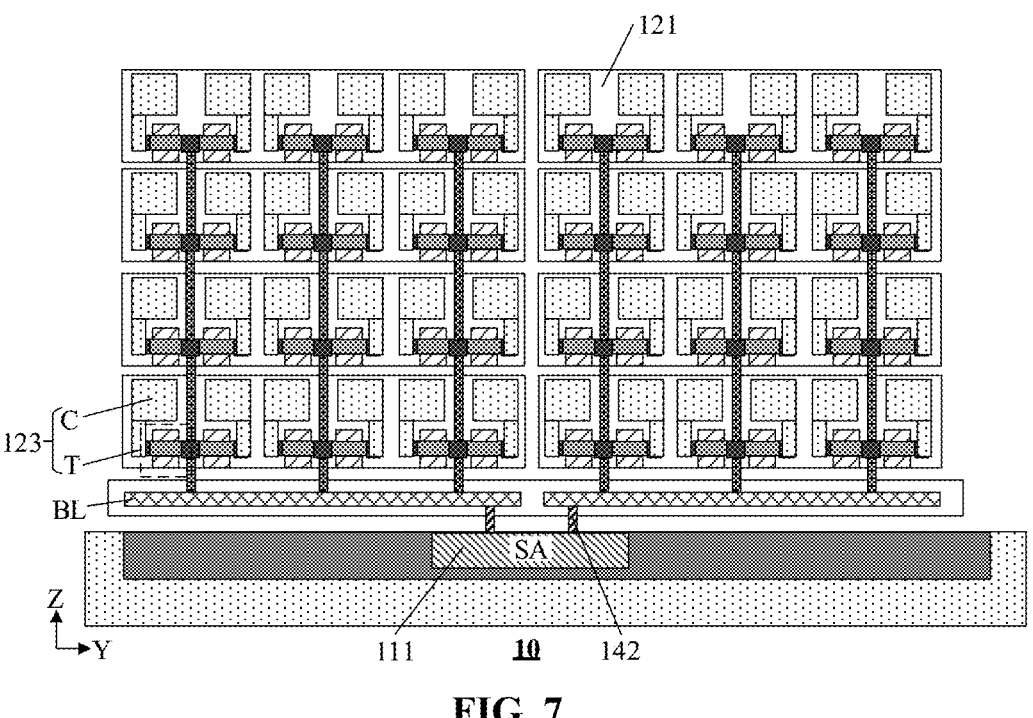
FIG. 7 is a schematic diagram of a Sense Amplifier (SA) in a memory according to an embodiment of the disclosure.

In some embodiments, as shown in FIG. 6 and FIG. 7, the control block 111 includes first control blocks connected to the WLs and second control blocks connected to the BLs.

As shown in FIG. 6, the control blocks 111 may include the first control blocks connected to the WLs. Here, the first control blocks include, but are not limited to, SWDs shown in FIG. 6. The SWD may be configured to drive the local WL of each memory block 121, that is, to provide a gating signal for each memory cell 123. Here, a sub WL connected to the SWD is specific to the concept of the local WL for the memory block 121, that is, the above-mentioned WL. Correspondingly, for the multiple memory blocks 121, a global WL may be connected to the multiple local WLs.

It is to be understood that one SWD may be connected to one WL and configured to conduct the selection transistor of each memory cell 123 connected to the WL.

For the memory cell 123 to be read and written, that is, a target memory cell, it is only necessary to provide a driving signal through the SWD corresponding to the target memory cell, and conduct the multiple memory cells 123 connected to the WL where the target memory cell is located through the WL connected thereto. At the same time, a corresponding data signal is provided for the BL connected to the target memory cell, so as to achieve the purpose of performing independent reading and writing operations on the target memory cell.

As shown in FIG. 7, the control block 111 may include the second control blocks connected to the BLs. The second control blocks include, but are not limited to, an SA in FIG. 7. The SA is also known as a sense amplifier, and is configured to amplify a small potential difference between a target BL and a reference BL in a process of reading and writing the memory cell 123. Here, the target BL may be the BL connected to the selection transistor of the current memory cell 123 performing reading or writing operation, and the reference BL may be any other BL connected to the target BL on the same SA. The memory cell 123 connected to the reference BL does not participate in reading and writing data at this time. In the embodiments of the disclosure, any two BLs may be connected to the same SA. When performing data reading and writing on the memory cell 123 connected to the first BL, this first BL is the target BL, and the other BL may be used as the reference BL.

Exemplarily, when performing data reading on the memory cell 123, the selection transistor of memory cell 123 is turned on, at this time, charges stored in the memory cell 123 may affect the potential of the target BL connected thereto, and then the small potential difference is generated between the target BL and the reference BL. The SA amplifies the potential difference, which is reflected in the target BL and the reference BL. In this way, data reading may be achieved by detecting a voltage difference between the target BL and the reference BL.

Here, the BL may be connected to the SA in the control block 111 through the second connection line 142.

In some embodiments, the BLs connected to the two adjacent memory blocks 121 in the second direction are connected to the same second control block.

Exemplarily, the two BLs located in the same memory structure layer 120 and connected to the two adjacent memory blocks 121 in the Y direction may be connected to the same SA. When one memory block 121 is in an operating state, the BL connected to the other memory block 121 is used as the reference BL, and the BL connected to the memory block 121 in the operating state is used as the target BL of the SA. In this way, the two memory blocks may perform the operations such as reading and writing alternately, which improves the service efficiency of the SA and reduces the area occupied by the SA.

In addition, the two adjacent memory blocks 121 in the different memory structure layers 120 may be connected to the same SA. However, in this case, the BLs connected to the two memory blocks 121 may not be shared, and two groups of BLs are used, which are used as the target BL and the reference BL respectively during the operation.

In some embodiments, the memory further includes data I/O circuits, each data I/O circuit is connected to the second control block, and the data I/O circuit is configured to perform data writing or reading on the memory cells through the second control block.

The data I/O circuit may be configured to exchange data with components other than the memory. Exemplarily, the data I/O circuit may be connected to the SA and perform the operations such as data reading and writing on the memory cells through the SA.

In some embodiments, the memory further includes a power circuit, connected to the multiple control blocks and configured to provide power supply signals. The power circuit is located in the substrate, and the power circuit and the control circuit layer are located in the same structure layer.

The power circuit may generate different voltages to meet the requirements of various devices in the memory during operations such as writing, reading, and the like. Exemplarily, the power circuit and the control circuit layer are located at the basically the same depth in the substrate to optimize the layout of the devices and circuits of the memory.

Figure 8:
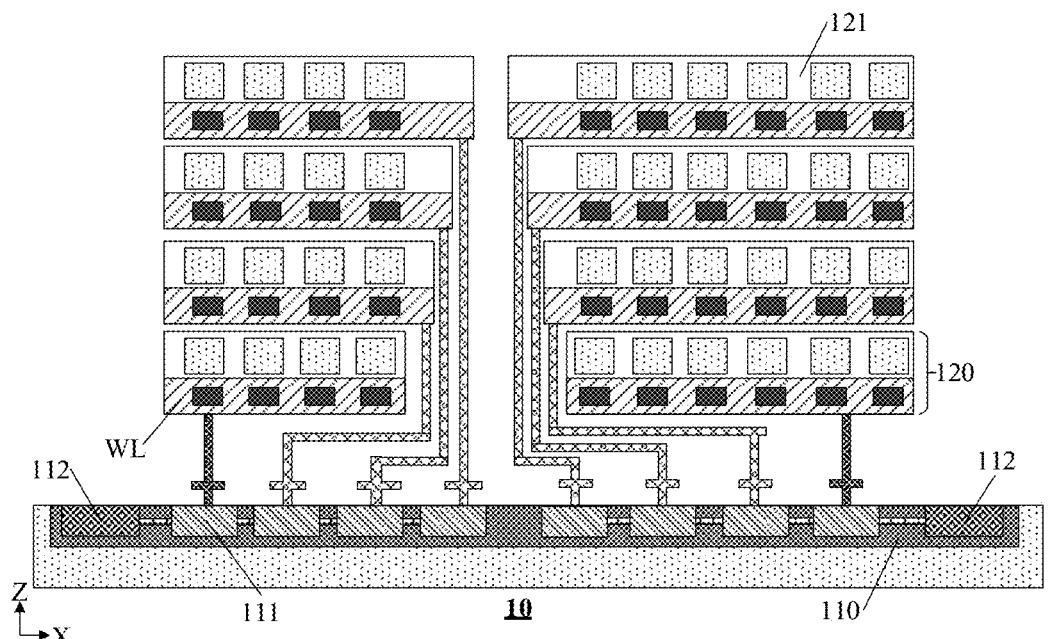
FIG. 8 is a schematic diagram of global control circuits in a memory according to an embodiment of the disclosure.

In some embodiments, as shown in FIG. 8, the control circuit layer 110 further includes global control circuits 112. Each of the global control circuits 112 is connected to multiple control blocks 111. The global control circuit 112 is at least configured to provide control signals for the multiple control blocks 111.

The global control circuit 112 may be connected to some memory blocks 121 or all of the memory blocks 121 of the memory 10 through multiple control blocks 111, and configured to provide the control signals for the multiple memory blocks 121.

In some embodiments, the global control circuit 112 includes a global WL driver circuit, connected to the multiple first control blocks and configured to provide control signals for the multiple WLs in each of the memory block 121 connected to the multiple first control blocks.

In the embodiments of the disclosure, the global WL driver circuit is connected to the multiple first control blocks, and connected to the multiple WLs in the multiple memory blocks 121 through the multiple first control blocks. The global WL driver circuit may also be connected to a row decoder, so as to control the conduction and cutoff of the selection transistors in the multiple memory blocks 121.

In some embodiments, the global control circuit 112 may further include a global SA. The global SA may be connected to the multiple second control blocks and connected to the multiple BLs through the multiple second control blocks, so as to control the memory cells 123 in the multiple memory blocks 121 to perform the operations such as reading and writing. It is to be understood that the global control circuit 112 may further include a row/column decoder, a fuse repair circuit, a buffer, etc.

In some embodiments, as shown in FIG. 8, an area where the global control circuit 112 is located is outside a projection area of any one of the memory blocks 121 on the control circuit layer 110.

Exemplarily, the global control circuit 112 may be located in a peripheral area of the control circuit layer 110, that is, outside the projection area of the memory structure layer

120. The global control circuit 112 may be connected to the multiple control blocks 111, thereby providing the control signals for the multiple control blocks 111. The global control circuit 112 may also be located between some control blocks 111, for example, in a gap between the two control blocks 111 in the middle of the multiple parallel control blocks 111.

The multiple control blocks 111 connected to the global control circuit 112 may be controlled in a time-sharing manner or synchronously, depending on the functions of the global control circuit and the corresponding control block 111 and connection relationship between the global control circuit and the corresponding control block 111, and no limits are made thereto here.

Figure 9:
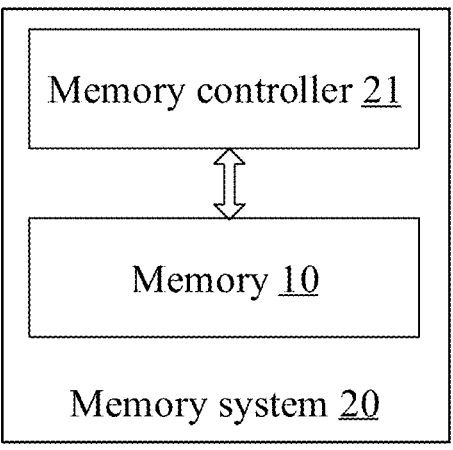
FIG. 9 is a schematic diagram of a memory system according to an embodiment of the disclosure.

As shown in FIG. 9, the embodiments of the disclosure also provide a memory system 20, which includes the memory 10 in any one of the above embodiments and a memory controller 21. The memory system 20 may be any memory chip. The memory controller 21 may control the memory 10 to perform various operations according to signals sent by a host. It is to be understood that, due to the adoption of the stacked memory structure layer and control circuit layer, the integration degree of the memory system 20 is relatively high. In addition, the through openings in the memory 10 facilitates the WL in each memory structure layer to be led out and connected to the control circuit layer, which simplifies the wiring design and manufacturing process.

It is to be noted that the features disclosed in some method or device embodiments provided in the disclosure may be freely combined without conflicts to obtain new method embodiments or device embodiments.

It is to be understood that "one embodiment" or "an embodiment" mentioned throughout the specification means that specific features, structures or characteristics related to the embodiment are included in at least one embodiment of the disclosure. Therefore, "in one embodiment" or "in an embodiment" appearing anywhere in the specification does not always refer to the same embodiment. In addition, these specific features, structures or characteristics may be combined in one or more embodiments freely as appropriate. It is to be understood that, in various embodiments of the disclosure, a magnitude of a sequence number of each process does not mean an execution sequence, and the execution sequence of each process should be determined by its function and an internal logic and should not form a limit to an implementation process of the embodiments of the disclosure. The sequence numbers of the embodiments of the disclosure are not intended to represent superiority or inferiority of the embodiments, but only for description.

It is to be noted that terms "include" and "contain" or any other variant thereof are intended to cover non-exclusive inclusions herein, such that a process, method, object or device including a series of elements not only includes those elements but also includes other elements not clearly listed or further includes elements inherent in the process, the method, the object or the device. Under the condition of no more limitations, a component defined by the statement "including a/an" does not preclude the existence of the same other components in a process, method, object or device including the component.

In several embodiments provided by the disclosure, it is to be understood that the disclosed device and method may be implemented in other manners. The device embodiments described above are only schematic, and for example, the division of the units is only logical function division, and other division manners may be adopted during practical implementation. For example, multiple units or components may be combined or integrated into another system, or some features may be neglected or not executed. In addition, the coupling or direct coupling or communication connection between each represented or discussed component may be indirect coupling or communication connection, implemented through some interfaces, of the device or the units, and may be electrical and mechanical or adopt other forms.

The units described as separate parts may or may not be physically separated, and the parts represented as units may or may not be physical units, and may be located in the same place, or may also be distributed to multiple network units. Part of all of the units may be selected according to a practical requirement to achieve the purposes of the solutions of the embodiments.

In addition, each functional unit in each embodiment of the disclosure may be integrated into a processing unit, each unit may also serve as an independent unit, and two or more than two units may also be integrated into one unit. The integrated unit may be implemented in a hardware form and may also be implemented in the form of a hardware and software functional unit.

In some examples, the terms "module" and "unit" and the like in the memory 10 may be implemented by one or more hardware circuits/sub-circuits and/or one or more processors. In some examples, a module or unit may include one or more circuits with or without stored code or instructions. The module or unit may include one or more components that are directly or indirectly connected. These components may or may not be physically attached to, or located adjacent to, one another.

The above is only the specific implementations of the disclosure and is not intended to limit the scope of protection of the disclosure. Any variations or replacements that are apparent to those skilled in the art within the technical scope disclosed by the disclosure shall fall within the scope of protection of the disclosure. Therefore, the scope of protection of the disclosure is subject to the scope of protection of the claims.

In a memory provided by the embodiments of the disclosure, at least two memory structure layers are sequentially stacked on the control circuit layer, and each WL in the at least one memory structure layer is connected to the control circuit layer through the through openings. In this way, on the one hand, the area occupied by the memory structure layer and the control circuit layer which are stacked is small, and the integration degree of the memory is improved; and on the other hand, the through openings facilitate the WLs in each memory structure layer to be led out and connected to the control circuit layer, which simplifies the wiring design and manufacturing process of the memory.

The invention claimed is:

1. A memory, comprising:
a substrate;
a control circuit layer located in the substrate, wherein the control circuit layer comprises at least part of control circuits of the memory; and
at least two memory structure layers, wherein the at least two memory structure layers are sequentially stacked on the control circuit layer, each of the at least two memory structure layers comprises a plurality of memory blocks arranged in an array, each of the plurality of memory blocks comprises a plurality of Word Lines (WLs) parallel to each other and extending in a first direction, and the first direction is parallel to a surface of the substrate;

wherein an opening is provided between adjacent memory blocks located in the same memory structure layer, openings located in different memory structure layers go through each other; and WLs in at least one of the at least two memory structure layers are connected to the control circuit layer through the openings that go through each other.

2. The memory of claim 1, wherein the openings located in the different memory structure layers have widths that sequentially decrease in an upward direction from the substrate.

3. The memory of claim 1, further comprising:
a plurality of connection structures, wherein each of the plurality of connection structures connects a respective WL to the control circuit layer in a direction perpendicular to the surface of the substrate.

4. The memory of claim 3, further comprising:
compensating resistors, wherein each of the compensating resistors is connected to a respective connection structure, and the compensating resistor has a resistance value inversely proportional to a length of the connection structure.

5. The memory of claim 3, wherein the opening is located between the adjacent memory blocks in the first direction, and the connection structures comprises:
first connection structures, wherein each of the first connection structures goes through at least one of the openings in the direction perpendicular to the surface of the substrate, and each WL in the memory structure layer above the memory structure layer at a lowest layer is connected to the control circuit layer through a respective first connection structure; and
second connection structures located between the memory structure layer at the lowest layer and the control circuit layer, wherein each WL in the memory structure layer at the lowest layer is connected to the control circuit layer through a respective one of the second connection structures.

6. The memory of claim 5, wherein the first connection structure is connected to the control circuit layer through the at least one opening from below the WL in a direction perpendicular to the substrate;
or, the first connection structure extends from an end, close to the opening, of the WL to the opening in the first direction, and is connected to the control circuit layer through the at least one opening in the direction perpendicular to the substrate.

7. The memory of claim 1, wherein the control circuit layer comprises a plurality of control blocks, each of the plurality of control blocks is connected to a respective memory block.

8. The memory of claim 7, wherein the memory block comprises:
a plurality of memory cells arranged in an array, wherein each WL is connected to a plurality of the memory cells arranged in the first direction; and
memory cells in the at least one memory structure layer are connected by WLs to the control block through the openings that go through each other.

9. The memory of claim 8, further comprising:
a Bit Line (BL) structure layer, located between the control circuit layer and the at least two memory structure layers, wherein
the BL structure layer comprises a plurality of BLs extending in a second direction, an angle is provided between the second direction and the first direction, and the second direction is parallel to the surface of the substrate; and each of the plurality of BLs is connected to a plurality of groups of memory cells arranged in the second direction, and each group of memory cells includes a plurality of memory cells connected through a first connection line and stacked in a direction perpendicular to the surface of the substrate.

10. The memory of claim 9, wherein the control blocks comprise:

first control blocks, each of the first control blocks being connected to a respective WL; and second control blocks connected to the BLs.

11. The memory of claim 10, wherein the BLs connected to two adjacent memory blocks in the second direction are connected to the same one of the second control blocks.

12. The memory of claim 10, further comprising:

data Input/Output (I/O) circuits, wherein each of the data I/O circuits is connected to a respective second control block, and the data I/O circuit is configured to perform data writing or reading on the memory cells through the second control block.

13. The memory of claim 7, further comprising:

a power circuit, connected to the plurality of control blocks and configured to provide power supply signals;

wherein the power circuit is located in the substrate, and the power circuit and the control circuit layer are located in the same structure layer.

14. The memory of claim 7, wherein the control circuit layer further comprises global control circuits;

each of the global control circuits is connected to a plurality of control blocks; and the global control circuit is at least configured to provide control signals for the plurality of control blocks.

15. The memory of claim 14, wherein the global control circuit comprises:

a global WL driver circuit, connected to a plurality of first control blocks and configured to provide control signals for the plurality of WLs in each of the memory blocks connected to the plurality of first control blocks.

16. The memory of claim 15, wherein an area in which the global control circuit is located is outside a projection area of each of the plurality of memory blocks on the control circuit layer.

17. A memory system, comprising:

a memory controller, and a memory, comprising:

a substrate;

a control circuit layer located in the substrate, wherein the control circuit layer comprises at least part of control circuits of the memory; and at least two memory structure layers, wherein the at least two memory structure layers are sequentially stacked on the control circuit layer, each of the at least two memory structure layers comprises a plurality of memory blocks arranged in an array, each of the plurality of memory blocks comprises a plurality of Word Lines (WLs) parallel to each other and extending in a first direction, and the first direction is parallel to a surface of the substrate;

wherein an opening is provided between adjacent memory blocks located in the same memory structure layer, openings located in different memory structure layers go through each other; and WLs in at least one of the at least two memory structure layers are connected to the control circuit layer through the openings that go through each other.

\* \* \* \* \*